(12) United States Patent
Tseng et al.

(10) Patent No.: US 12,471,223 B2
(45) Date of Patent: Nov. 11, 2025

(54) POWER SUPPLY ASSEMBLY

(71) Applicant: Delta Electronics, Inc., Taoyuan (TW)

(72) Inventors: Chi-Yuan Tseng, Taoyuan (TW); Chi-Shou Ho, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 210 days.

(21) Appl. No.: 18/393,206

(22) Filed: Dec. 21, 2023

(65) Prior Publication Data
US 2025/0185185 A1 Jun. 5, 2025

(30) Foreign Application Priority Data
Dec. 4, 2023 (CN) .......................... 202311645074.6

(51) Int. Cl.
*H05K 5/00* (2025.01)
*H05K 1/11* (2006.01)
*H05K 7/20* (2006.01)

(52) U.S. Cl.
CPC ............. *H05K 5/006* (2013.01); *H05K 1/118* (2013.01); *H05K 5/0069* (2013.01); *H05K 7/20909* (2013.01); *H05K 2201/10106* (2013.01)

(58) Field of Classification Search
CPC ...... H05K 5/006; H05K 5/0069; H05K 1/118; H05K 7/20909
USPC ........................................................ 361/749
See application file for complete search history.

(56) References Cited

U.S. PATENT DOCUMENTS

| | | | |
|---|---|---|---|
| 4,054,353 A | 10/1977 | Saunders | |
| 2014/0364048 A1* | 12/2014 | Milligan | H05K 7/20581 454/184 |
| 2018/0124889 A1* | 5/2018 | Xiong | F21V 17/101 |
| 2019/0346894 A1 | 11/2019 | Chang et al. | |
| 2021/0298192 A1 | 9/2021 | Peng et al. | |

FOREIGN PATENT DOCUMENTS

| | | |
|---|---|---|
| CN | 205793617 U | 12/2016 |
| CN | 218161917 U | 12/2022 |

OTHER PUBLICATIONS

Artman, Paul et al., Modular Hardware System-Common Redundant Power Supply (M-CRPS) Base Specification, Open Compute Project M-CRPS Version 1.00 Release Candidate 4, Nov. 1, 2022, pp. 1-320.

* cited by examiner

*Primary Examiner* — Andargie M Aychillhum
(74) *Attorney, Agent, or Firm* — KIRTON McCONKIE; Evan R. Witt

(57) ABSTRACT

A power supply assembly is provided and includes a housing, a flexible circuit board, an insulator and a circuit board assembly. The housing includes a positioning base disposed on a carrying surface. The flexible circuit board is disposed on the carrying surface, extended from a first end side of the housing to the positioning base, and including a LED indicator adjacent to the first end side and an elastic conductor located on the positioning base. The flexible circuit board is sandwiched between the carrying surface and the insulator, and the elastic conductor protrudes through the insulator. The circuit board assembly includes a main circuit board having a conductive pad corresponding to the elastic conductor. The circuit board assembly is assembled to the insulator, the conductive pad is close to the insulator and abutted against the elastic conductor, so that the LED indicator and the main circuit board are electrically connected.

15 Claims, 14 Drawing Sheets

POWER SUPPLY ASSEMBLY

CROSS-REFERENCE TO RELATED APPLICATION

This application claims priority to China Patent Application No. 202311645074.6, filed on Dec. 4, 2023, the entire content of which is incorporated herein by reference for all purposes.

FIELD OF THE INVENTION

The present disclosure relates to a power supply, and more particularly to a power supply assembly implementing the electrical connection of LED indicator and fan through a flexible circuit board to simplify the assembly structure, improve the space utilization and achieve the automated assembly of the main circuit board.

BACKGROUND OF THE INVENTION

With the rapid development of electrical industry, power supply becomes more and more important in recent years as an essential power supply device. Hence, improving the structure and manufacturing process of the power supply becomes more valuable as well. Nowadays, during the manufacturing process of the power supply, the assembling operation is mostly done artificially. Therefore, the circuit board, the electronic element and the electrical and structural connections therebetween are prevented from being damaged during assembling process. Moreover, when assembling each component of the power supply, the position of the fixing hole should be calibrated artificially for fastening.

For some electrical devices, such as LED indicator or a fan, disposed adjacent to the end side of the housing of the power supply assembly, they need to be connected to the power supply unit on the internal main circuit board through a flying wire. However, when the flying wire is utilized to electrically connect the LED indicator or the fan to the power supply unit on the main circuit board in the prior power supply assembly, the flying wire must be manually arranged above the main circuit board and then inserted into the connection terminals. The flying wire must avoid the components disposed on the main circuit board. Furthermore, the flying wire may be lifted after assembly, so that the height limit is affected. In addition to occupying the device space above the main circuit board, the arrangement of the flying wires cannot be completed through the automated assembly.

Therefore, there is a need of providing a power supply assembly implementing the electrical connection of LED indicator and a fan through a flexible circuit board to simplify the assembly structure, improve the space utilization, achieve the automated assembly of the main circuit board and overcome the above drawbacks.

SUMMARY OF THE INVENTION

An object of the present disclosure provides a power supply assembly implementing the electrical connection of LED indicator and a fan through a flexible circuit board to simplify the assembly structure, improve the space utilization and achieve the automated assembly of the main circuit board.

Another object of the present disclosure provides a power supply assembly. The flexible circuit board that realizes the electrical connection of the LED indicator and the fan for power supply is arranged under the main circuit board and does not occupy the space for the components on the main circuit board. In addition, due to the thin thickness of the flexible circuit board, the space for the components under the main circuit board won't be occupied by the flexible circuit board. When the flexible circuit board is fixed to the carrying surface of the housing, it allows to simplify the assembly process through the design of the positioning base, the positioning posts and the positioning holes. On the other hand, the elastic conductor of the flexible circuit board can be supported by the protruding platform stamped from the housing or by adding a reinforcing plate, and the protruding height of the elastic conductor through the opening of an insulator is adjustable to increase the reliability of the assembly structure.

A further object of the present disclosure provides a power supply assembly. When the LED indicator and the fan are disposed adjacent to the rear side of the housing, the power supply requirement can be realized through the flexible circuit board, and the flexible circuit board is fixed by the assembly and clamping of the housing and the insulator. The elastic conductor of the flexible circuit board is exposed and protruded to a protruding height through the opening of the insulator. When the main circuit board of the circuit board assembly is assembled to the insulator and the housing, an installation gap less than the protruding height is formed. Consequently, the conductive pad on the bottom surface of the main circuit board is close to the opening of the insulator and abutted against the elastic conductor to form an electrical connection. Thereby, the assembly process is simplified, and the assembly of the main circuit board can be achieved through the automated assembly. On the other hand, when the circuit board assembly is installed on the housing and the insulator, the input socket, the primary side circuit, the secondary side circuit and the output golden fingers on the circuit board assembly are arranged from the rear end side of the housing to the front side of the housing. The power supply requirements for the electrical devices adjacent to the rear side can be connected through the flexible circuit board between the insulator and the housing, and then electrically connected to the synchronous rectifier (SR) circuit board on the secondary side circuit through the conductive pad on the bottom of the main circuit board. The flexible circuit board is sandwiched between the housing and the insulator, and a sufficient distance is maintained between the primary side circuit and the secondary side circuit. In other words, since the LED indicator and the fan arranged adjacent to the rear side of the housing are electrically connected to the conductive pad below the main circuit board through the flexible circuit board, it helps to simplify the assembly structure of the housing, the flexible circuit board, the insulator and the circuit board assembly. Moreover, the flexible circuit board can be pre-fixed to the housing. It avoids the use of the flying wire and won't be restricted by the wire management. Consequently, the space utilization is improved and it has advantage of realizing the automatic assembly of the main circuit board.

In accordance with an aspect of the present disclosure, a power supply assembly is provided. The power supply assembly includes a housing, a flexible circuit board, an insulator and a circuit board assembly. The housing includes a first end side and a second end side opposite to each other, a carrying surface and a positioning base, wherein the positioning base is disposed on the carrying surface and located between the first end side and the second end side. The flexible circuit board is disposed on the carrying surface, and extended from the first end side along a first direction to the positioning base, wherein the flexible circuit board includes a LED indicator and an elastic conductor, the LED indicator is disposed adjacent to the first end side of the housing, and the elastic conductor is disposed on the positioning base. The insulator includes an opening spatially corresponding to the elastic conductor and the positioning base, wherein the insulator is assembled to the carrying surface of the housing, the flexible circuit board is arranged between the carrying surface of the housing and the insulator, and the elastic conductor is exposed through the opening. The circuit board assembly includes a main circuit board having a conductive pad spatially corresponding to the opening and the elastic conductor, wherein the circuit board assembly is assembled to the insulator, the conductive pad of the main circuit board is close to the opening, and the conductive pad and the elastic conductor are abutted against each other, so that the LED indicator and the main circuit board are electrically connected to each other.

In an embodiment, the flexible circuit board further includes a connector disposed adjacent to the first end side of the housing and electrically connected to the elastic conductor.

In an embodiment, the power supply assembly further includes a fan disposed adjacent to the first end side of the housing and electrically connected to the connector.

In an embodiment, the housing, the flexible circuit board, the insulator and the circuit board assembly are assembled along a second direction sequentially, wherein the second direction is perpendicular to the first direction.

In an embodiment, the circuit board assembly includes a primary side circuit and a secondary side circuit, which are spatially corresponding to the first end side of the housing and the second end side of the housing, respectively.

In an embodiment, the main circuit board includes a gold finger spatially corresponding to the second end side of the housing, and disposed adjacent to the second end side.

In an embodiment, the power supply assembly further includes an input socket connected to the main circuit board and disposed adjacent to the first end side of the housing.

In an embodiment, the input socket, the primary side circuit, the secondary side circuit and the gold finger are disposed on the main circuit board and arranged along the first direction sequentially, the primary side circuit is located between the input socket and the secondary side circuit, and the secondary side circuit is located between the primary side circuit and the gold finger.

In an embodiment, the positioning base includes a protruding platform stamped from the carrying surface and configured to support the elastic conductor of the flexible circuit board.

In an embodiment, the positioning base includes at least one positioning post, and the flexible circuit board includes at least one first positioning hole spatially corresponding to the at least one positioning post, wherein the at least one positioning post passes through the at least one first positioning hole to facilitate the flexible circuit board to be assembled to the carrying surface of the housing along a second direction, and allow the elastic conductor to locate on the protruding platform, wherein the second direction is perpendicular to the first direction.

In an embodiment, the insulator further includes at least one auxiliary positioning hole spatially corresponding to the at least one positioning post and disposed adjacent to the opening, wherein the at least one positioning post passes through the at least one auxiliary positioning hole to facilitate the opening of the insulator to align to the elastic conductor of the flexible circuit board.

In an embodiment, the positioning base includes a reinforcing plate connected between the flexible circuit board and the carrying surface, and configured to support the elastic conductor of the flexible circuit board.

In an embodiment, the positioning base includes at least one positioning post, the flexible circuit board includes at least one first positioning hole spatially corresponding to the at least one positioning post, and the reinforcing plate includes at least one second positioning hole spatially corresponding to the at least on positioning post, wherein the at least one positioning post passes through the at least one second positioning hole and the at least one first positioning hole sequentially to facilitate the reinforcing plate and the flexible circuit board to be assembled to the carrying surface of the housing along a second direction, wherein the second direction is perpendicular to the first direction.

In an embodiment, the insulator further includes at least one auxiliary positioning hole spatially corresponding to the at least one positioning post and disposed adjacent to the opening, wherein the at least one positioning post passes through the at least one auxiliary positioning hole to facilitate the opening of the insulator to align to the elastic conductor of the flexible circuit board.

In an embodiment, the housing, the flexible circuit board and the insulator are assembled to form a protruding height between the elastic conductor of the flexible circuit board and the insulator, the main circuit board is assembled on the insulator to form an installation gap between the conductive pad of the main circuit board and the insulator, and the installation gap is smaller than the protruding height.

In an embodiment, the circuit board assembly further includes a synchronous rectifier circuit board inserted into the main circuit board and spatially corresponding to the conductive pad.

DETAILED DESCRIPTION OF THE PREFERRED EMBODIMENT

Figure 1:
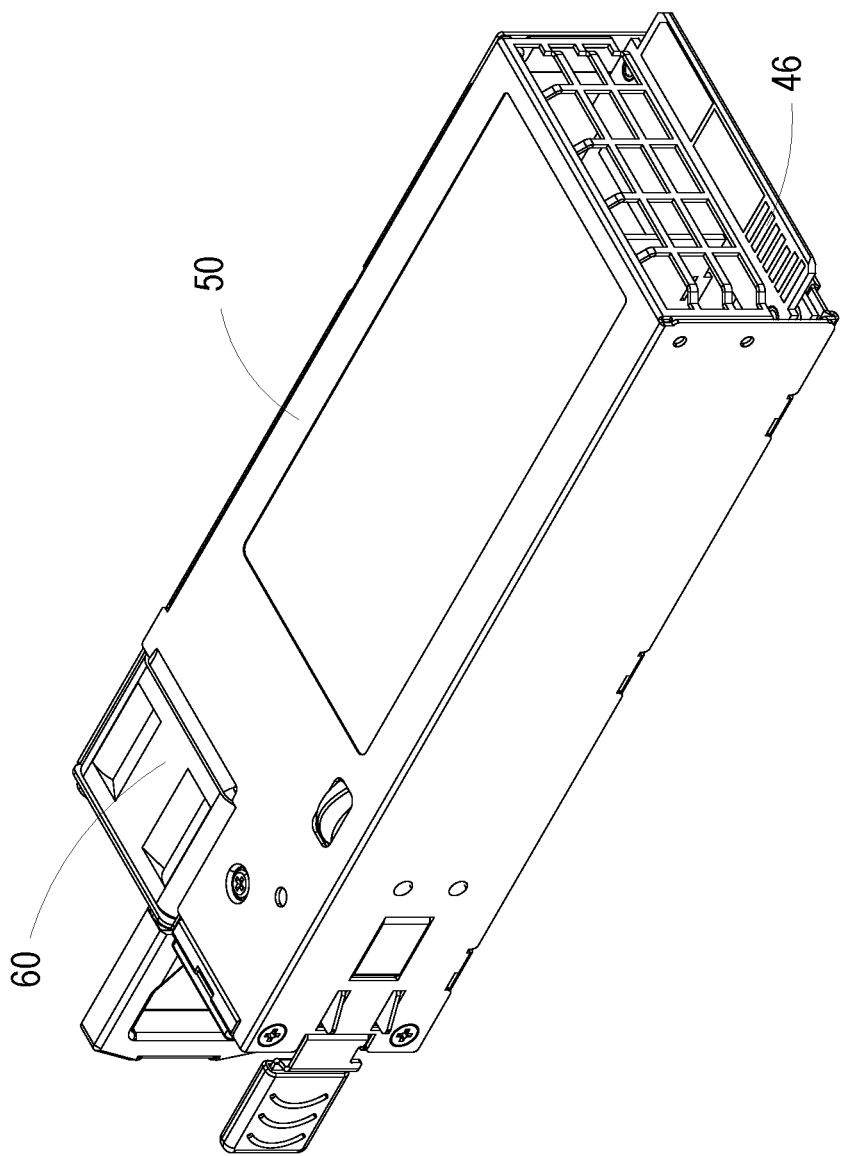
FIG. 1 is a schematic perspective view illustrating a power supply assembly according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "upper," "lower," "top," "bottom," "front," "rear" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments.

Please refer to FIG. 1 to FIG. 7. A power supply assembly according to a first embodiment of the present disclosure is disclosed. In the embodiment, the power supply assembly 1 includes a housing 10, a flexible circuit board 20, an insulator 30 and a circuit board assembly 4. Notably, both of the housing 10 and the insulator 30 are two-piece disassembled and assembled structures. In order to illustrate the assembling relationship between the housing 10, the flexible circuit board (FPC) 20, the insulator 30 and the circuit board assembly 4, the housing 10 and the insulator 30 are referred to the parts that assemble and carry the circuit board assembly 4. The other parts assembled later are marked as an upper cover assembly 50. The combination type of the housing 10 and the insulator 30 is not limited thereto in the present disclosure and explained here first. In the embodiment, the housing 10 includes a first end side 11 and a second end side 12 opposite to each other, a carrying surface 13 and a positioning base 14. Preferably but not exclusively, the first end side 11 and the second end side 12 are the rear end side and front end side opposite to each other along a first direction (i.e., the X axial direction). In the embodiment, the positioning base 14 is disposed on the carrying surface 13 and located between the first end side 11 and the second end side 12. Preferably but not exclusively, the flexible circuit board 20 is disposed on the carrying surface 13 of the housing 10 from top to bottom along a second direction (i.e., the inverse Z axial direction). The second direction is perpendicular to the first direction. In the embodiment, the flexible circuit board 20 is in a long-strip shape and extends from the first end side 11 of the housing 10 to the positioning base 14 along the first direction (i.e., the X axial direction) when assembled to the carrying surface 13. In the embodiment, the flexible circuit board 20 includes a LED indicator 23 and an elastic conductor 24, which are respectively disposed adjacent to the rear end 21 and a front end 22 opposite each other. Preferably but not exclusively, the LED indicator 23 of the flexible circuit board 20 is disposed adjacent to the first end side 11 of the housing 10 for displaying the usage status of the power supply. The elastic conductor 24 disposed adjacent to the front end 22 is electrically connected to the LED indicator 23 disposed adjacent to the rear end 21. In other embodiments, there are a plurality of elastic conductors 24 arranged along the Y axial direction and configured to conduct the required power supply to the LED indicator 23 or other additional devices on the rear end 21. The present disclosure is not limited thereto. In the embodiment, when the flexible circuit board 20 is assembled on the carrying surface 13 of the housing 10, the elastic conductor 24 is disposed on the positioning base 14. In the embodiment, the insulator 30 includes a rear end 31 and a front end 32 spatially corresponding to the first end side 11 and the second end side 12 of the housing 10, respectively, and includes an opening 33 passing through the top surface and the bottom surface. In the embodiment, the opening 33 is spatially corresponding to the elastic conductor 24 of the flexible circuit board 20 and the positioning base 14 of the housing 10. In the embodiment, when the insulator 30 is assembled to the carrying surface 13 of the housing 10 from top to bottom along the second direction (i.e., the inverse Z axial direction), the flexible circuit board 20 is arranged between the carrying surface 13 of the housing 10 and the bottom surface of the insulator 30. In addition, the elastic conductor 24 of the flexible circuit board 20 is exposed through the opening 33 of the insulator 30. In the embodiment, the circuit board assembly 4 at least includes a main circuit board 40. The main circuit board 40 includes the rear end 41 and the front end 42 spatially corresponding to the first end side 11 and the second end side 12 of the housing 10, respectively. The main circuit board 40 has a conductive pad 43 disposed on the bottom surface, and the conductive pad 43 is spatially corresponding to the opening 33 of the insulator 30 and the elastic conductor 24 of the flexible circuit board. When the circuit board assembly 4 is assembled to the insulator 30 along the second direction (i.e., the inverse Z axial direction), the conductive pad 43 on the bottom surface of the main circuit board 40 is close to the opening 33 of the insulator 30, and the conductive pad 43 of the main circuit board 40 and the elastic conductor 24 of the flexible circuit board 20 are abutted against each other (as shown in FIG. 6B), so that the LED indicator 23 and the main circuit board 40 are electrically connected to each other. Thereby, the assembling process is simplified, and it allows to realize the automatic assembly of the main circuit board.

Figure 3:
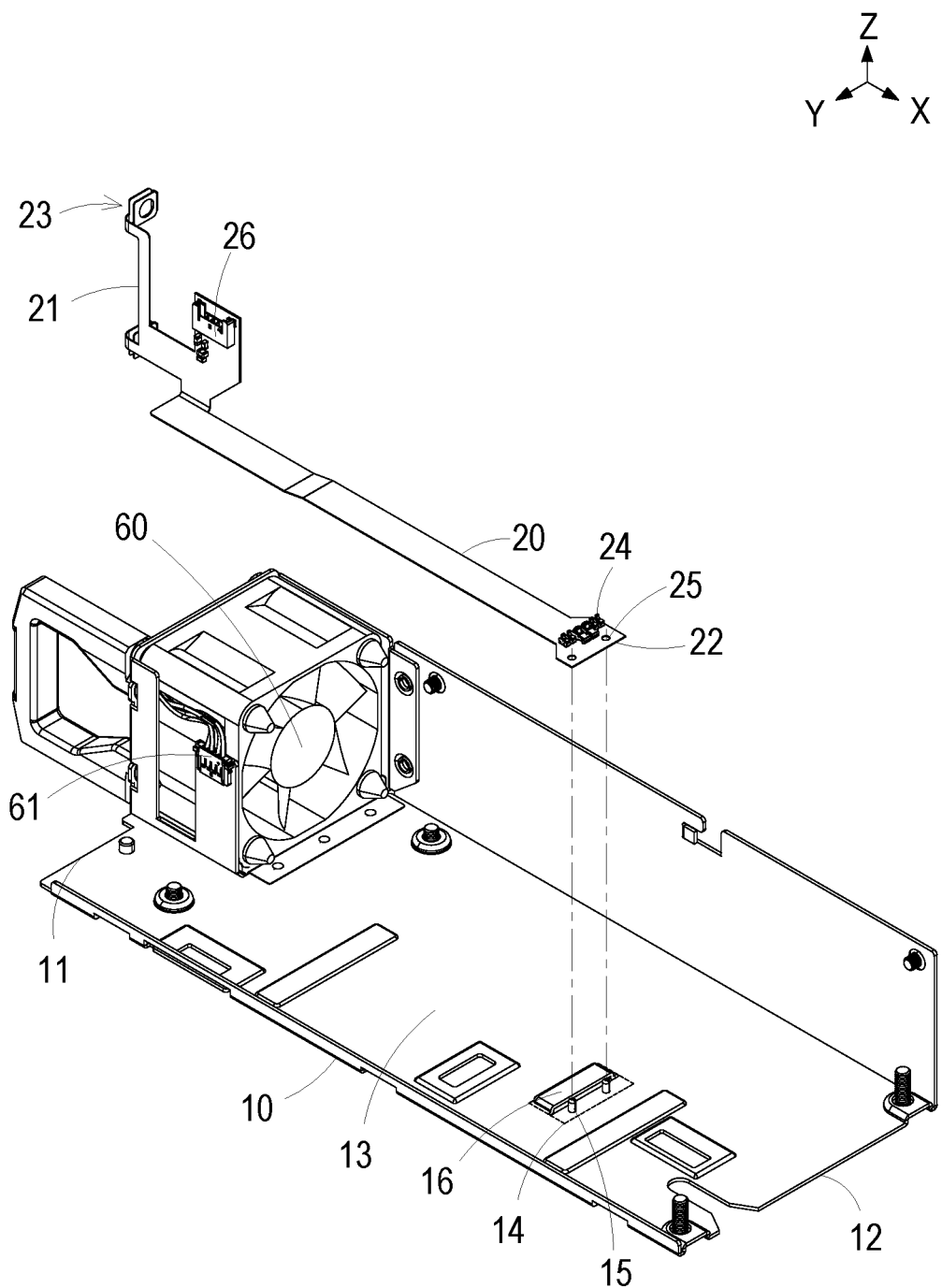
FIG. 3 shows the flexible circuit board correspondingly assembled to the carrying surface of the housing according the first embodiment of the present disclosure.
Figure 4:
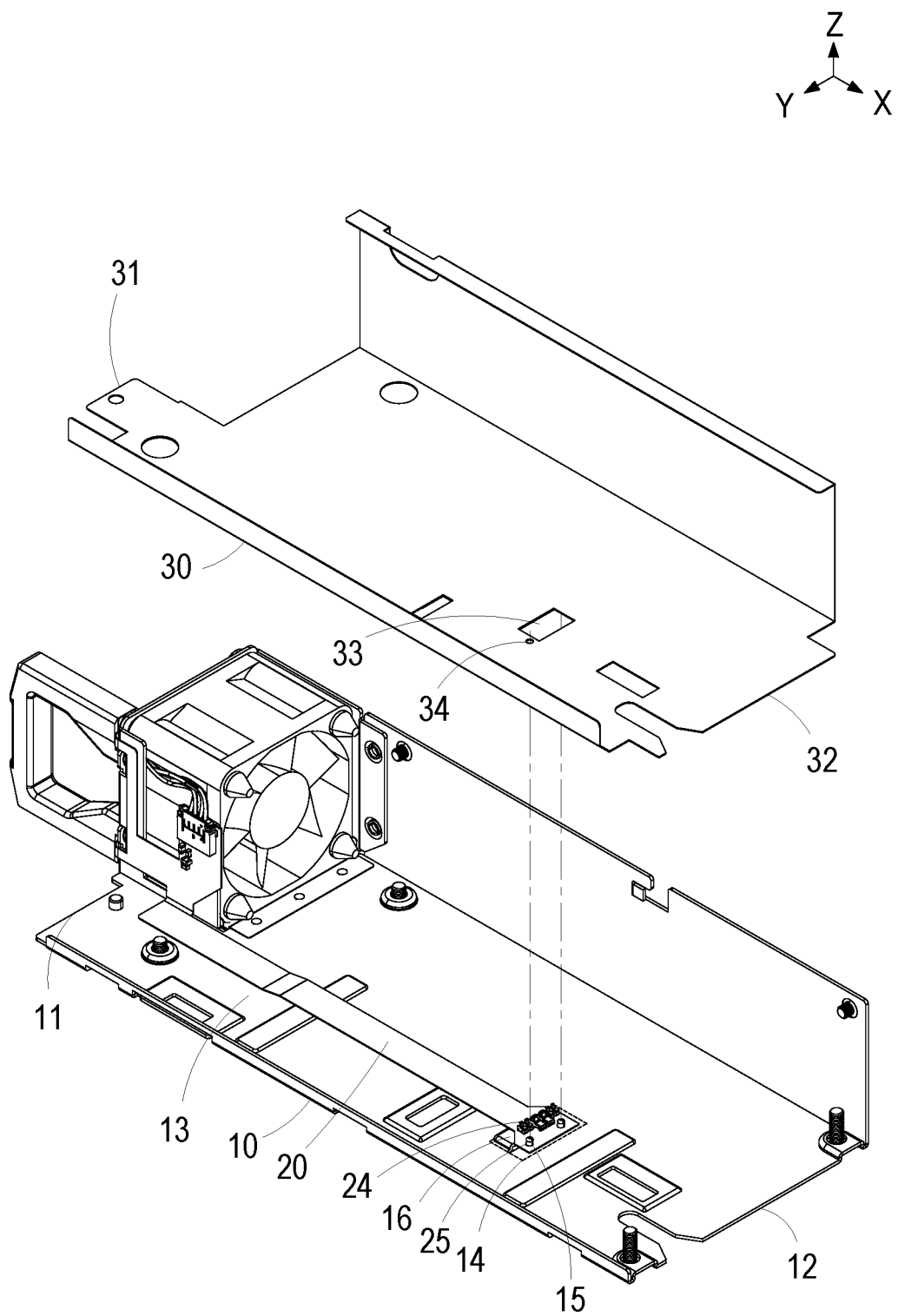
FIG. 4 shows the insulator correspondingly assembled to the flexible circuit board and the carrying surface of the housing according the first embodiment of the present disclosure.
Figure 5:
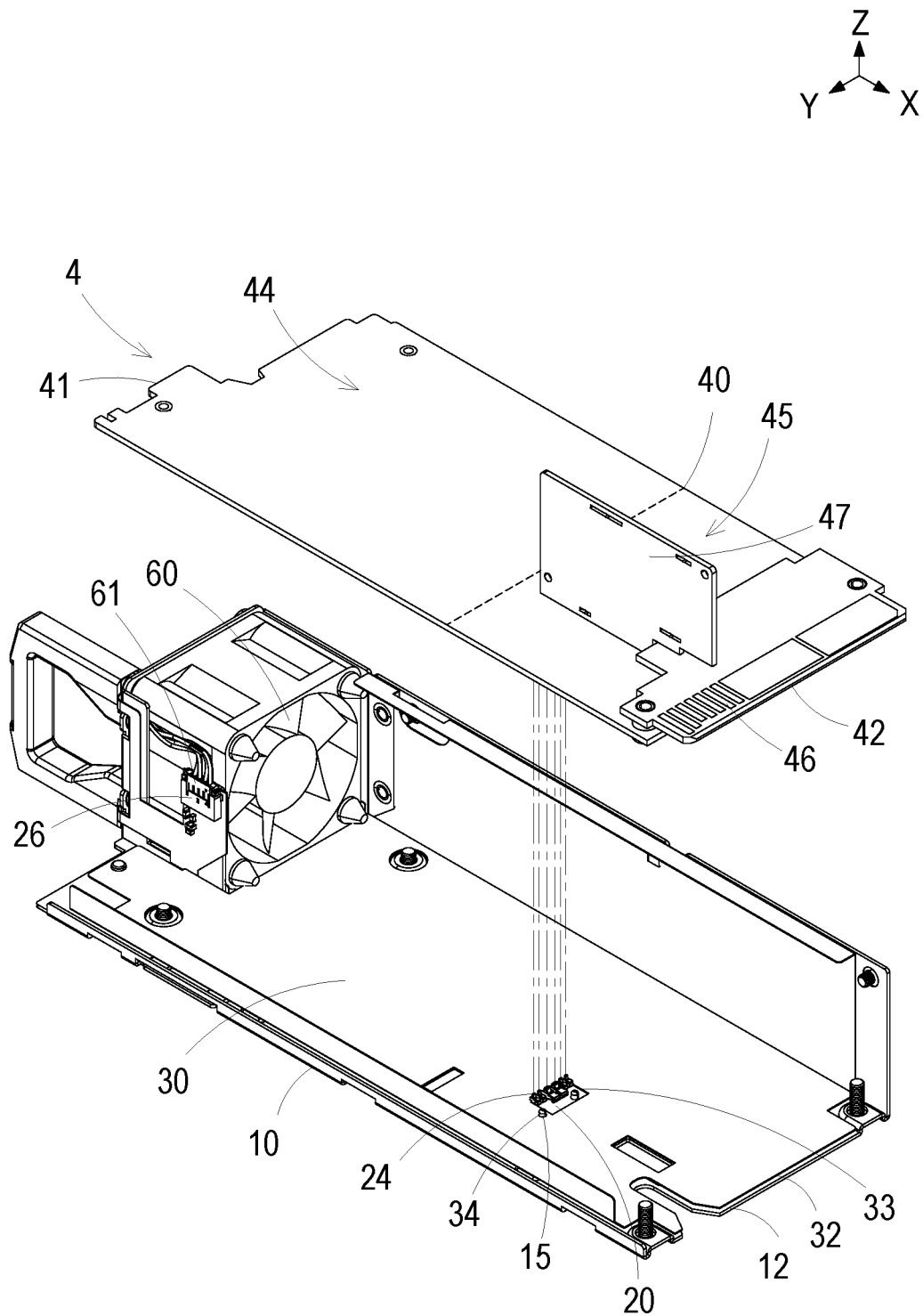
FIG. 5 shows the circuit board assembly correspondingly assembled to the insulator according the first embodiment of the present disclosure.

In the embodiment, the flexible circuit board 20 further includes a connector 26 disposed adjacent to the first end side 11 of the housing 10 and electrically connected to the elastic conductor 24. The power supply assembly 1 further includes a fan 60 disposed adjacent to the first end side 11 of the housing 10 and electrically connected to the connector 26 through a connection plug 61. Since the LED indicator 23 23 and the fan 60 are both located adjacent to the first end side 11 (the rear end side) of the housing 10 and electrically connected to the elastic conductor 24 of the flexible circuit board 20, the power supply requirement therefor can be realized through the strip-shaped flexible circuit board 20. As shown in FIG. 3 to FIG. 5, in the embodiment, the housing 10, the flexible circuit board 20, the insulator 30 and the circuit board assembly 4 are assembled along the second direction (i.e., the inverse Z axial direction) sequentially. Preferably but not exclusively, in an embodiment, it allows to sandwich the flexible circuit board 20 by assembling the housing 10 and the insulator 30. Preferably but not exclusively, in another embodiment, the flexible circuit board 20 is pre-attached or fixed to the housing 10 or the insulator 30 for the subsequent assembly. The housing 10, the flexible circuit board 20, the insulator 30 and the circuit board assembly 4 can be fixed through the fasteners such as the screws or other methods after being assembled together. The present disclosure is not limited thereto. Since the power supply connections of the LED indicator 23 and the fan 60 are realized through the flexible circuit board 20 arranged below the main circuit board 40, the space for the components on the main circuit board 40 won't be occupied by the flexible circuit board 20. In addition, due to the thin thickness of the flexible circuit board 20, the space for the components under the main circuit board 40 won't be occupied by the flexible circuit board. Moreover, the arrangement of the flexible circuit board 20 avoids the use of flying wires and won't be restricted by wire management. Consequently, the space utilization is improved and it facilitates to realize the automatic assembly of the main circuit board 40.

In the embodiment, the circuit board assembly 4 in the power supply assembly 1 further includes a primary side circuit 44 and a secondary side circuit 45 for AC/DC power conversion. After being assembled, the primary side circuit 44 and the secondary side circuit 45 are spatially corresponding to the first end side 11 of the housing 10 and the second end side 12 of the housing 10, respectively. In the embodiment, the power supply assembly 1 further includes an input socket 51, which is connected to the rear end 41 of the main circuit board 40, disposed adjacent to the first end side 11 of the housing 10, and configured to input the power. The main circuit board 40 further includes a gold finger 46 spatially corresponding to the second end side 12 of the housing 10. In the embodiment, the input socket 51, the primary side circuit 44, the secondary side circuit 45 and the gold finger 46 are disposed on the main circuit board 40 and arranged along the first direction (i.e., the X axial direction) sequentially, the primary side circuit 44 is located between the input socket 51 and the secondary side circuit 45, and the secondary side circuit 45 is located between the primary side circuit 44 and the gold finger 46. On the other hand, the circuit board assembly 4 further includes a synchronous rectifier (SR) circuit board 47 inserted into the main circuit board 40 and spatially corresponding to the conductive pad 43. Preferably but not exclusively, the SR circuit board 47 is located in the area where the secondary side circuit 45 is located. When the DC power supply requirements for the LED indicator 23 and the fan 60 at the first end side 11 (the rear end side) is conducted from the secondary side circuit 45, it must cross the primary side circuit 44 and a sufficient distance needs to be maintained between the primary side circuit 44 and the secondary side circuit 45. The electrical connection achieved through the flexible circuit board 20 can avoid the space waste caused by the use of flying wires and solve the problem of wire management. It helps to improve the space utilization and realize the automatic assembly of the main circuit board 40.

In the embodiment, the positioning base 14 of the housing 10 further includes a protruding platform 16, which is stamped from the carrying surface 13 to protrude upwardly and configured to support the elastic conductor 24 of the flexible circuit board 20. In the embodiment, the positioning base 14 includes at least one positioning post 15, and the flexible circuit board 20 includes at least one first positioning hole 25 spatially corresponding to the at least one positioning post 15. When the flexible circuit board 20 and the housing 10 are being assembled (as shown in FIG. 3), the at least one positioning post 15 passes through the at least one first positioning hole 25 to facilitate the flexible circuit board 20 to be assembled to the carrying surface 13 of the housing 10 along the second direction (i.e., the inverse Z axial direction), and allow the elastic conductor 24 to locate on the protruding platform 16 of the positioning base 14. In addition, the insulator 30 further includes at least one auxiliary positioning hole 34 spatially corresponding to the at least one positioning post 15 and disposed adjacent to the opening 33. When the insulator 30 is being assembled to the flexible circuit board 20 and the housing 10 (as shown in FIG. 4), the at least one positioning post 15 passes through the at least one auxiliary positioning hole 34 to facilitate the opening 33 of the insulator 30 to align to the elastic conductor 24 of the flexible circuit board 20. In other words, when the flexible circuit board 20 or the insulator 30 is fixed to the carrying surface 13 of the housing 10 through the design of the positioning base 14, the first positioning post 15, the first positioning hole 25 and the auxiliary positioning hole 34, it helps to simplify the assembly process. Certainly, the present disclosure is not limited thereto.

Figure 6A:
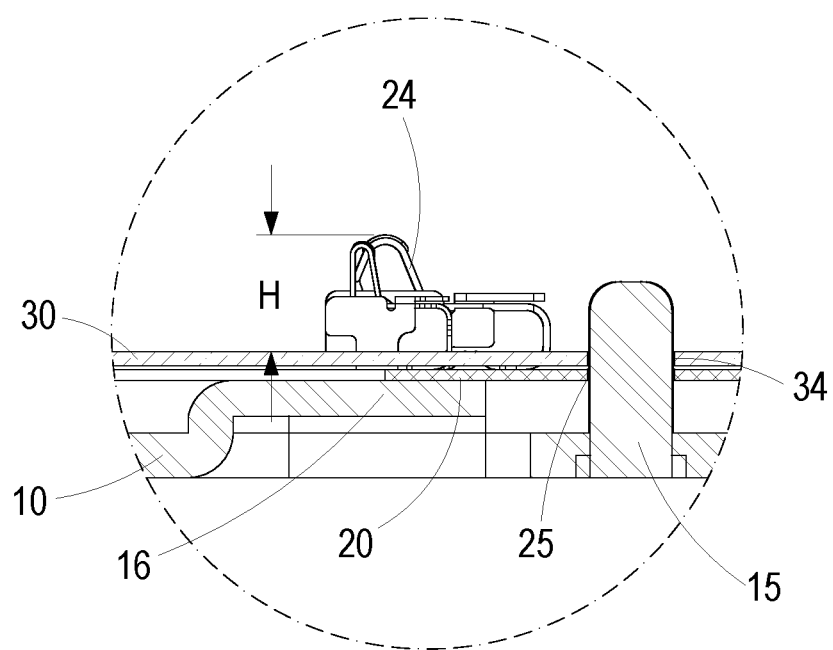
FIGS. 6A and 6B show the state of the elastic conductor in the power supply assembly before and after the main circuit board is assembled thereon according to the first embodiment of the present disclosure, respectively.
Figure 6B:
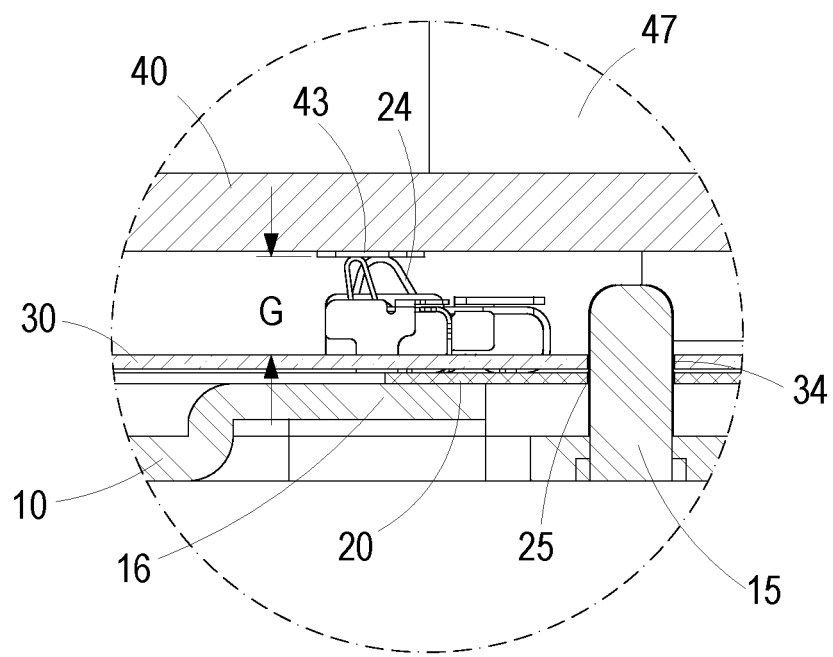

In the embodiment, after the housing 10, the flexible circuit board 20 and the insulator 30 are assembled, a protruding height H (as shown in FIG. 6A) is formed between the elastic conductor 24 of the flexible circuit board 20 and the top surface of the insulator 30. In addition, after the main circuit board 40 is assembled on the insulator 30, an installation gap G (as shown in FIG. 6B) is formed between the conductive pad 43 of the main circuit board 40 and the top surface of the insulator 30. Since the installation gap G is smaller than the protruding height H, when the main circuit board 40 of the circuit board assembly 4 is assembled to the insulator 30 and the housing 10, the conductive pad 43 on the bottom surface of the main circuit board 40 is close to the opening 33 of the insulator 30 and abutted against the elastic conductor 24 to form an electrical connection. Thereby, the assembly process is simplified, and the assembly of the main circuit board 40 can be achieved through the automated assembly. Certainly, the type in which the conductive pad 43 abutted against the elastic conductor 24 in the present disclosure is adjustable according to the practical requirements. On the other hand, the elastic conductor 24 of the flexible circuit board 20 can be supported by the protruding platform 16 stamped from the housing 10, and the protruding height H of the elastic conductor 24 through the opening 33 of the insulator 30 is adjustable to increase the reliability of the assembly structure. Certainly, the present disclosure is not limited thereto.

Figure 2A:
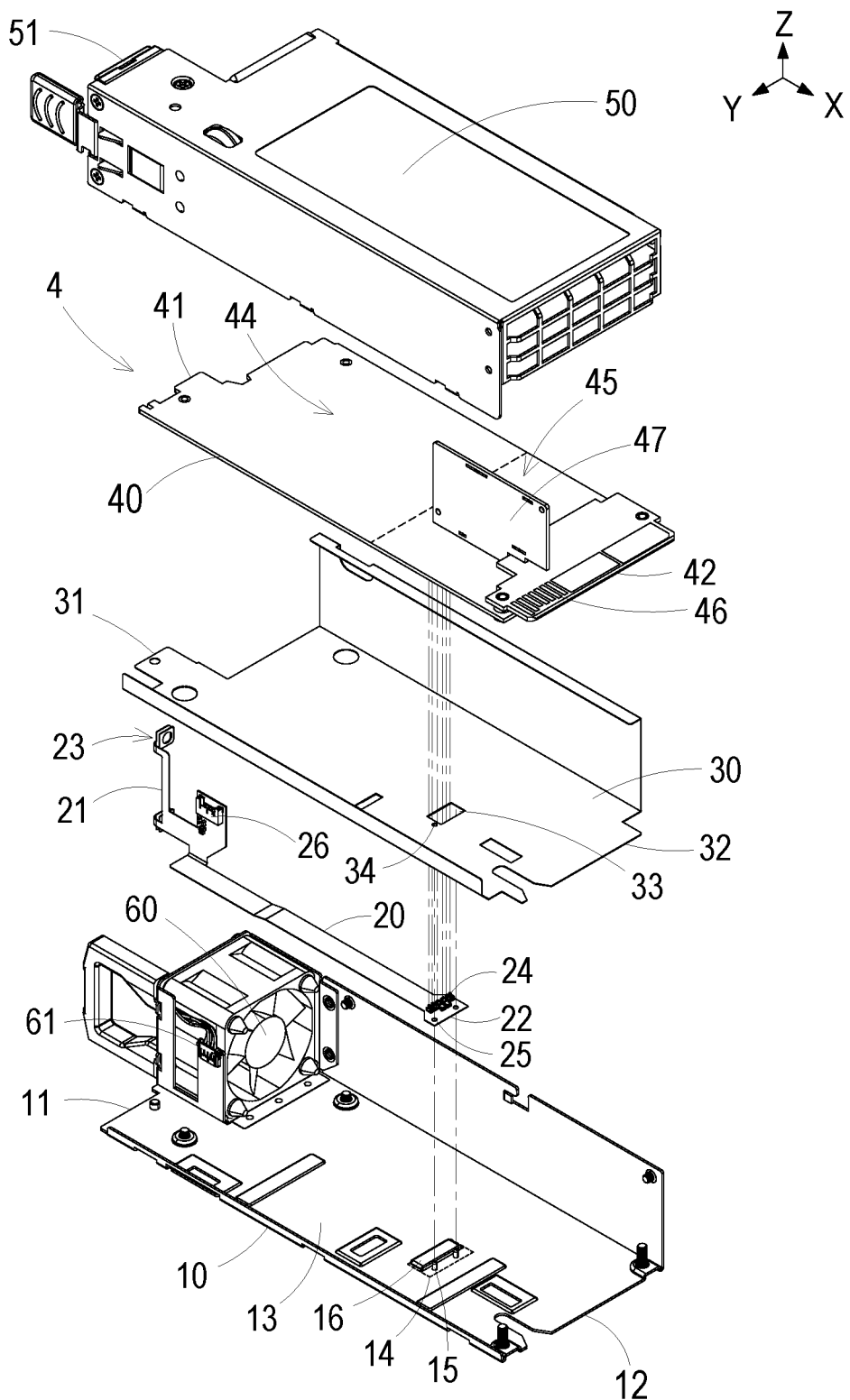
FIGS. 2A and 2B are exploded views illustrating the power supply assembly according to the first embodiment of the present disclosure.
Figure 2B:
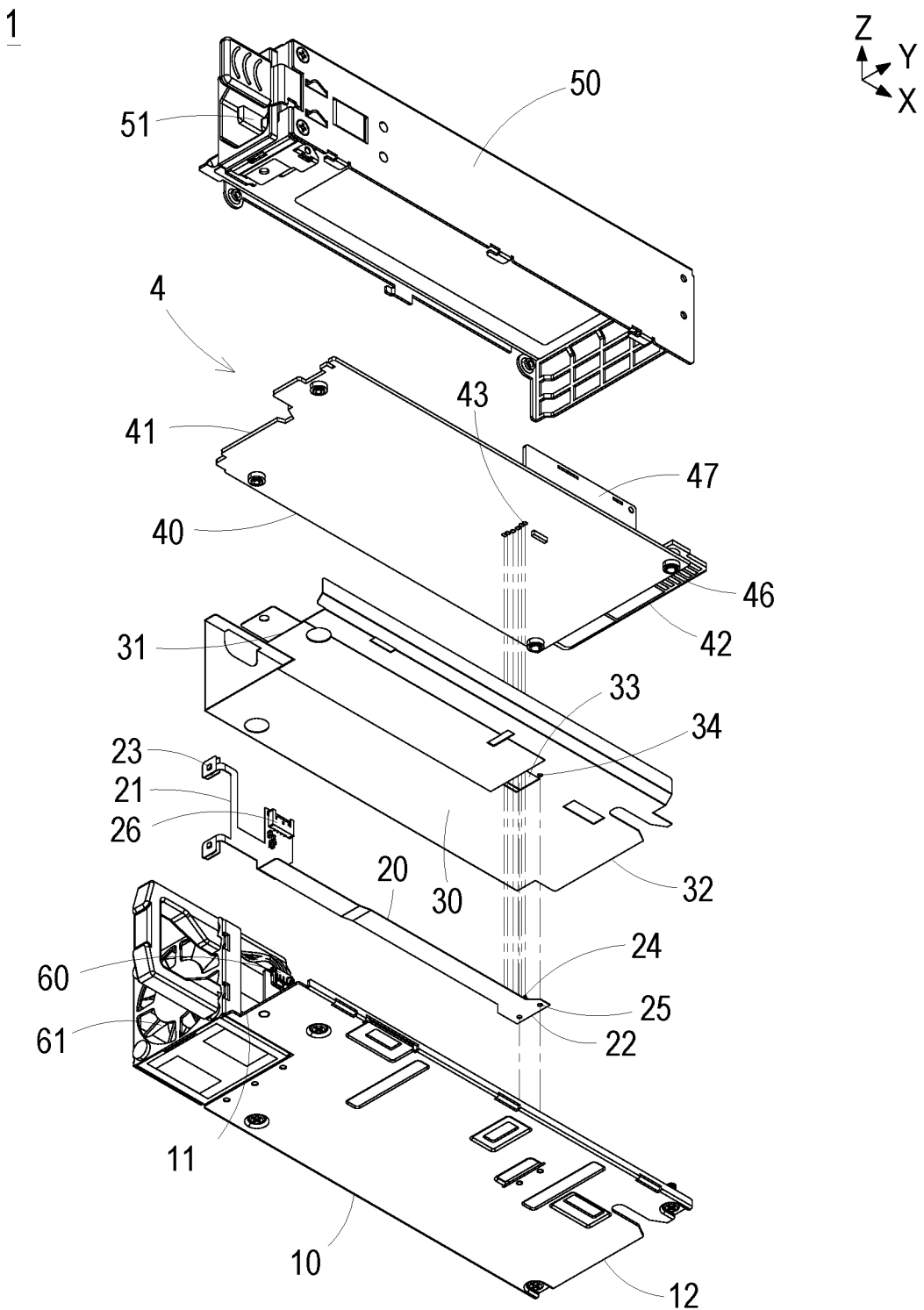
Figure 7:
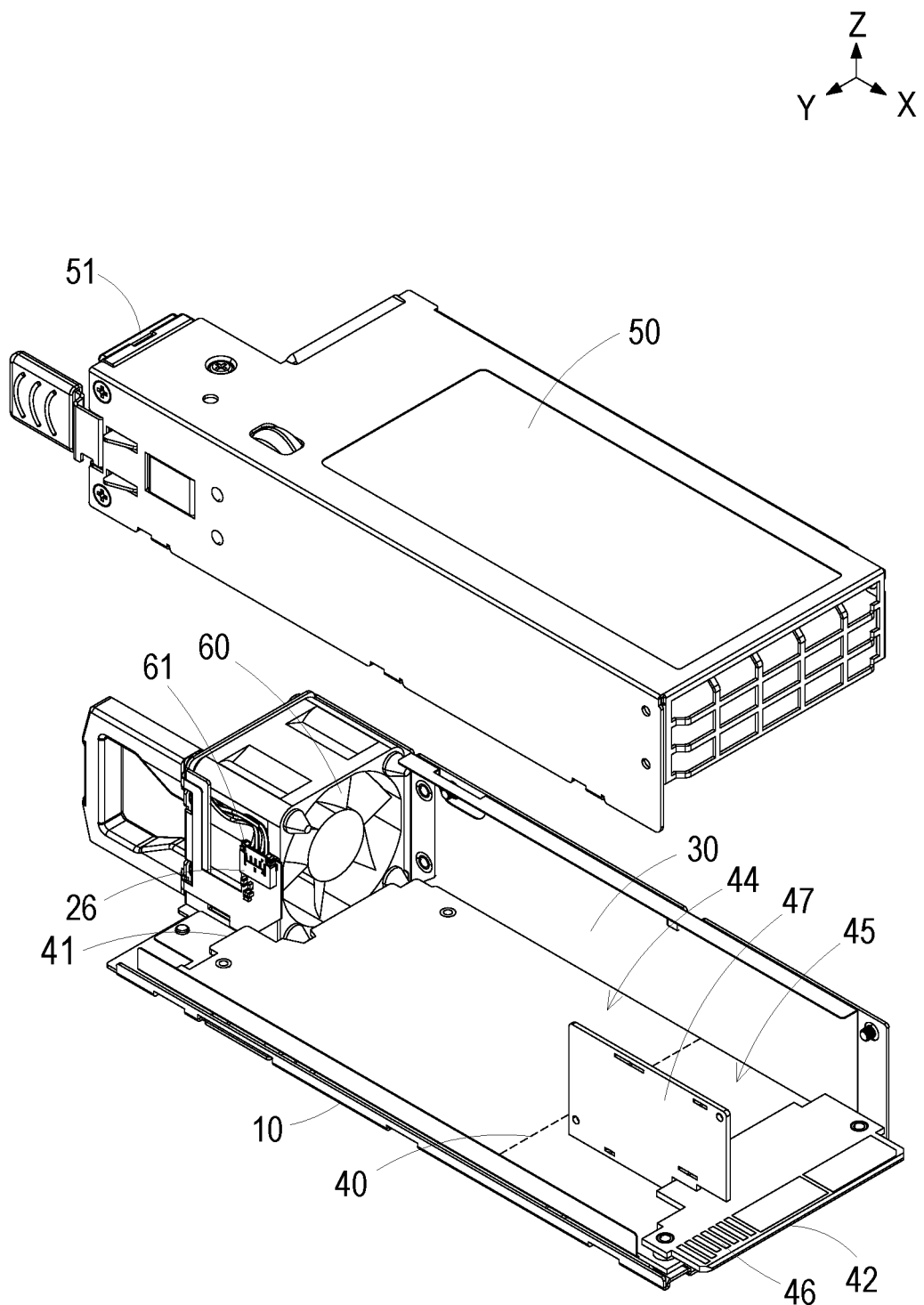
FIG. 7 shows the upper cover assembly correspondingly assembled to the power supply assembly according to the first embodiment of the present disclosure.
Figure 8A:
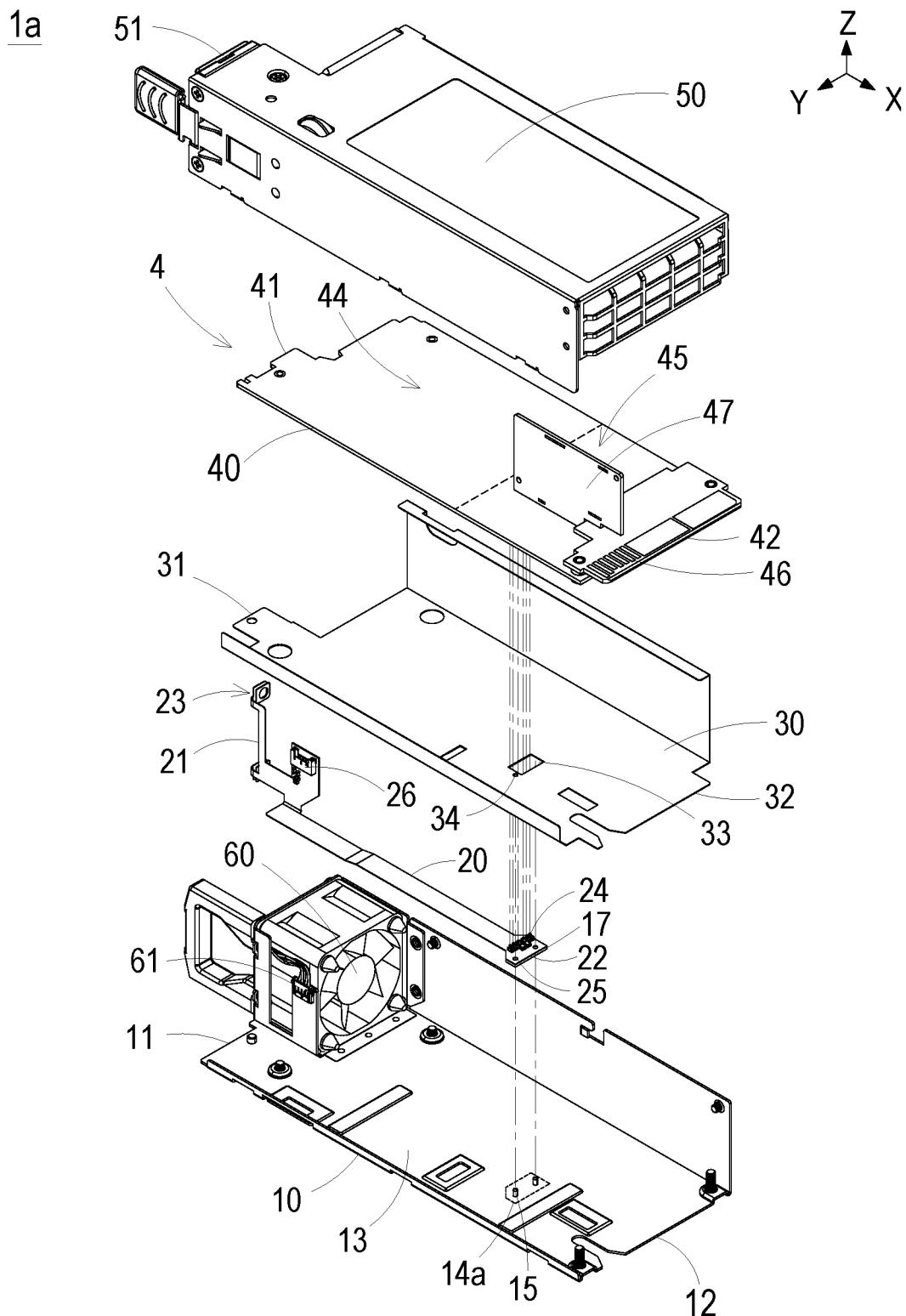
FIGS. 8A and 8B are exploded views illustrating a power supply assembly according to a second embodiment of the present disclosure.
Figure 8B:
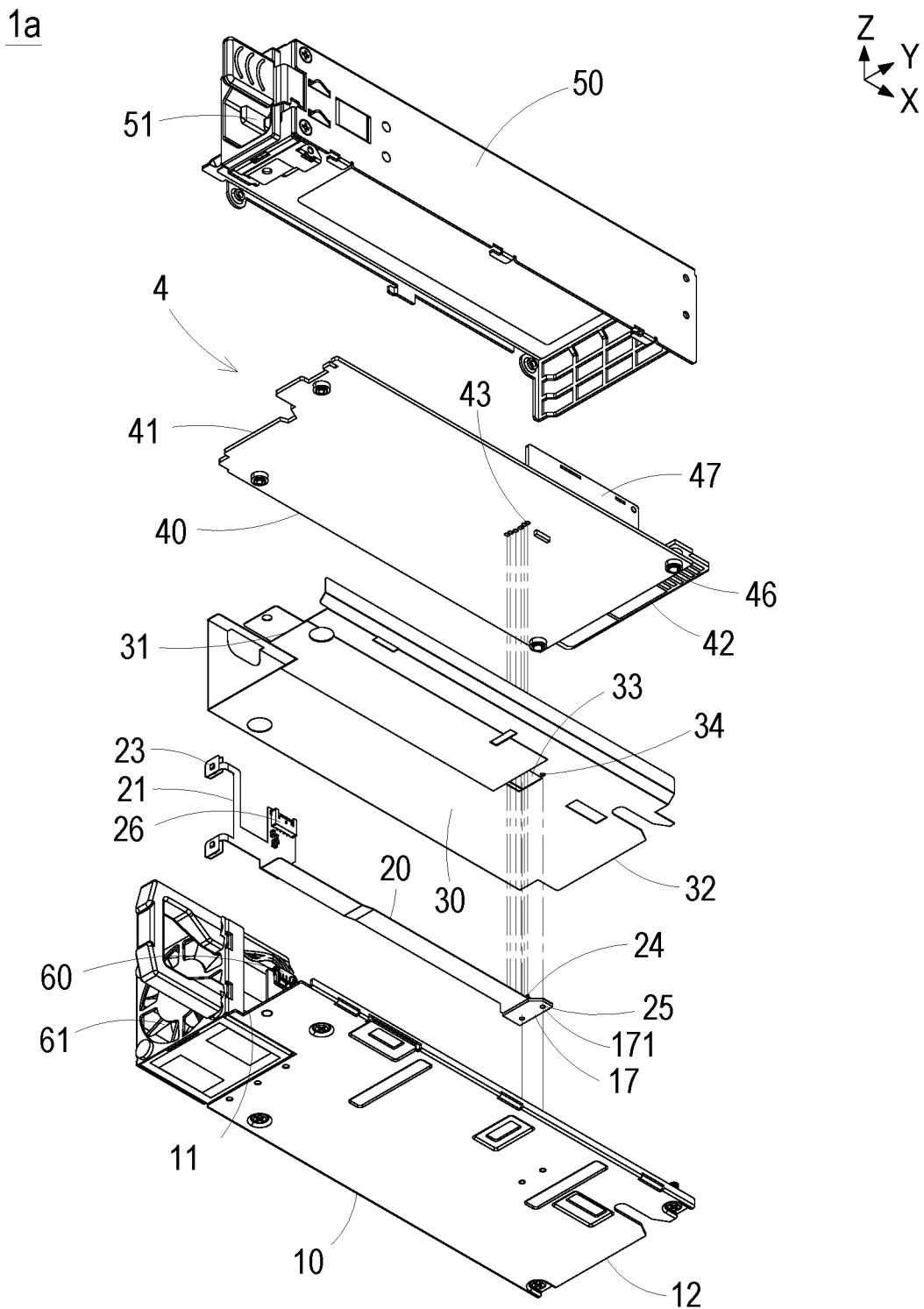

Moreover, in the embodiment, the housing 10 and the insulator 30 are two-piece disassembled and assembled structures. As shown in FIG. 7, after the housing 10, the flexible circuit board 20, the insulator 30 and the circuit board assembly 4 are assembled (referred to FIG. 5), the other upper cover assembly 50 or the input socket 51 can be assembled. Certainly, in other embodiments, the assembly sequence of each disassembled component in the power supply assembly 1 (as shown in FIG. 2A and FIG. 2B) is adjustable according to the practical requirements. It is not an essential feature to limit the present disclosure, and not redundantly described hereafter.

Figure 9:
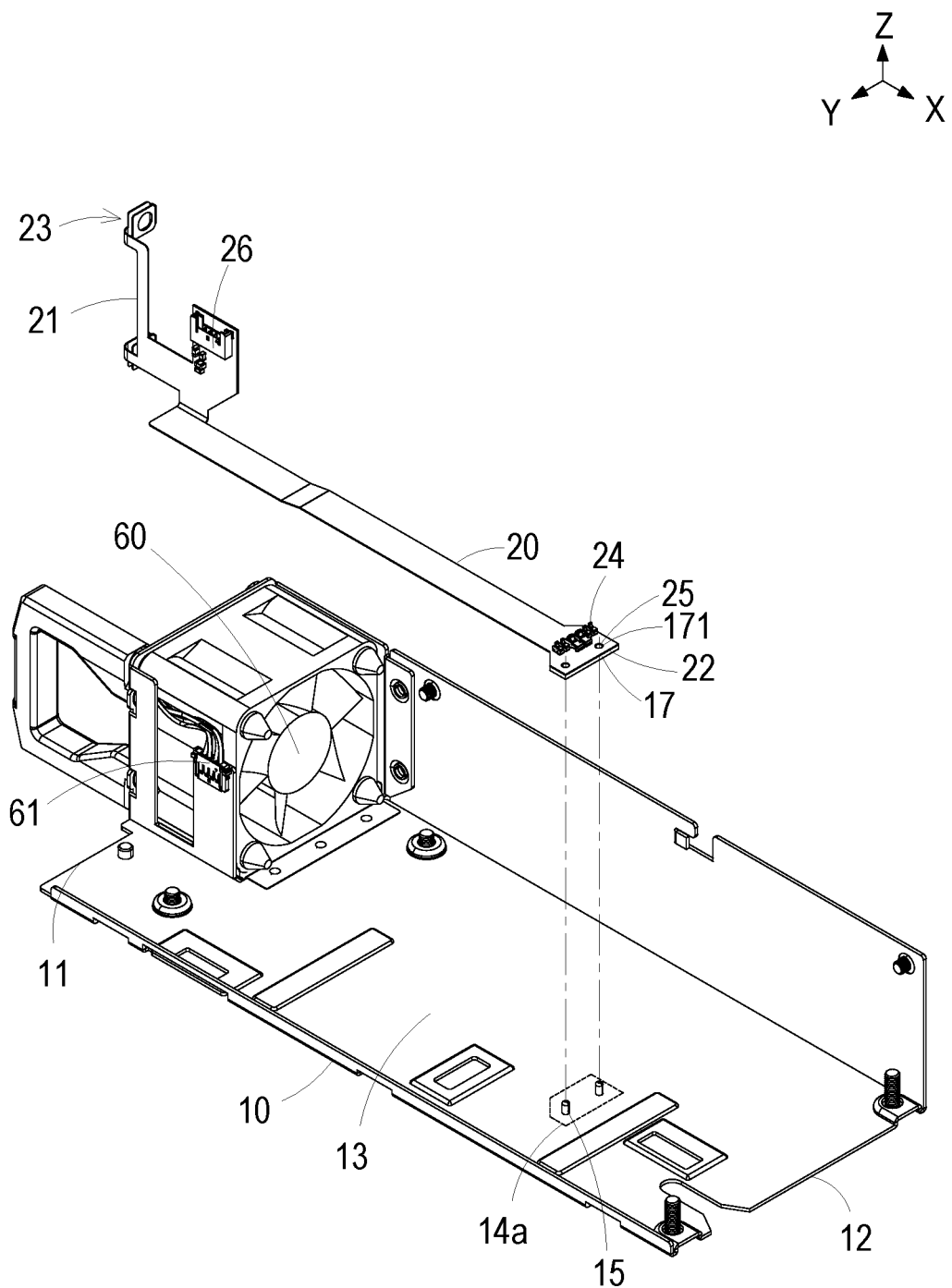
FIG. 9 shows the flexible circuit board correspondingly assembled to the carrying surface of the housing according the second embodiment of the present disclosure.
Figure 10:
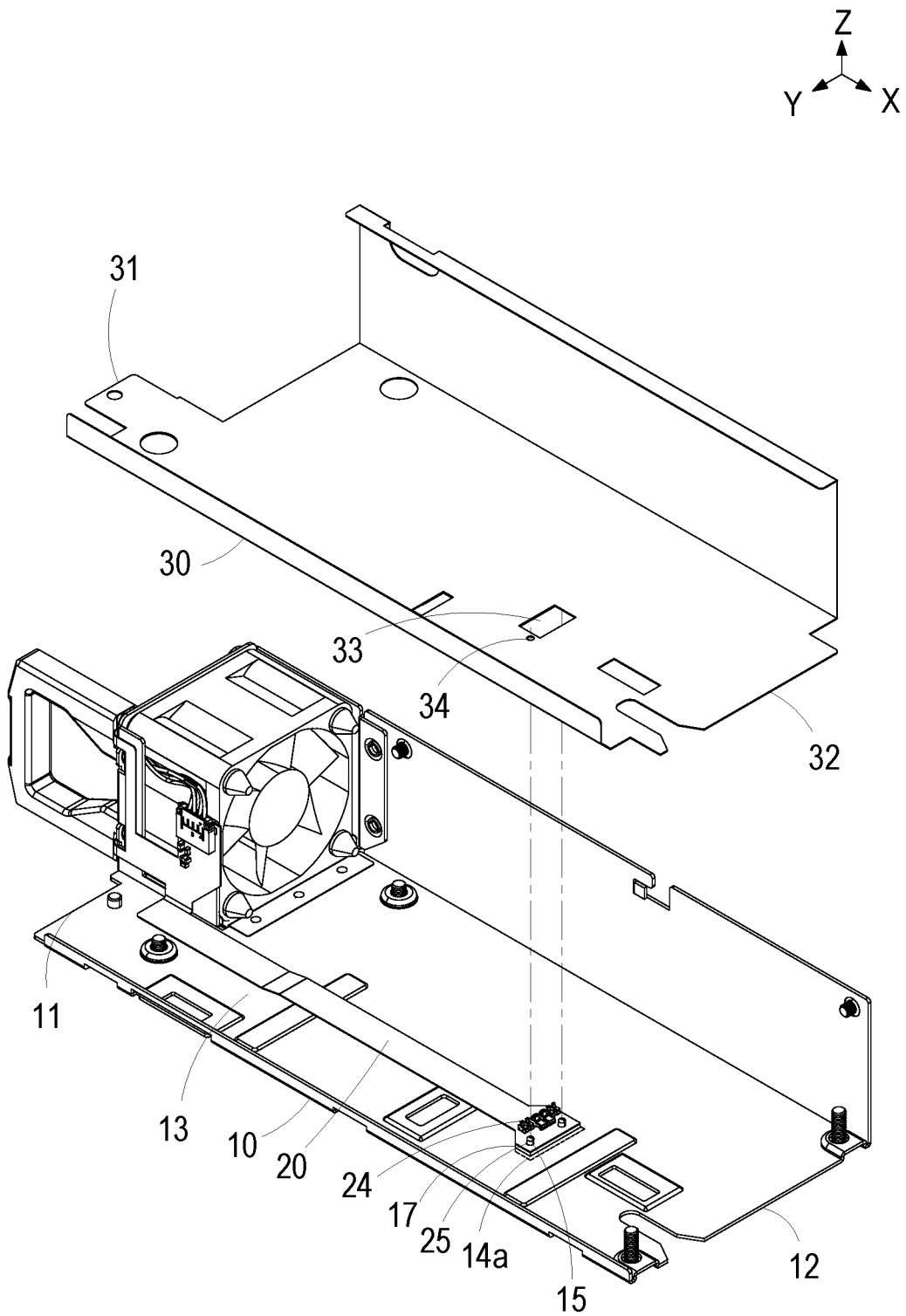
FIG. 10 shows the insulator correspondingly assembled to the flexible circuit board and the carrying surface of the housing according the second embodiment of the present disclosure.
Figure 11:
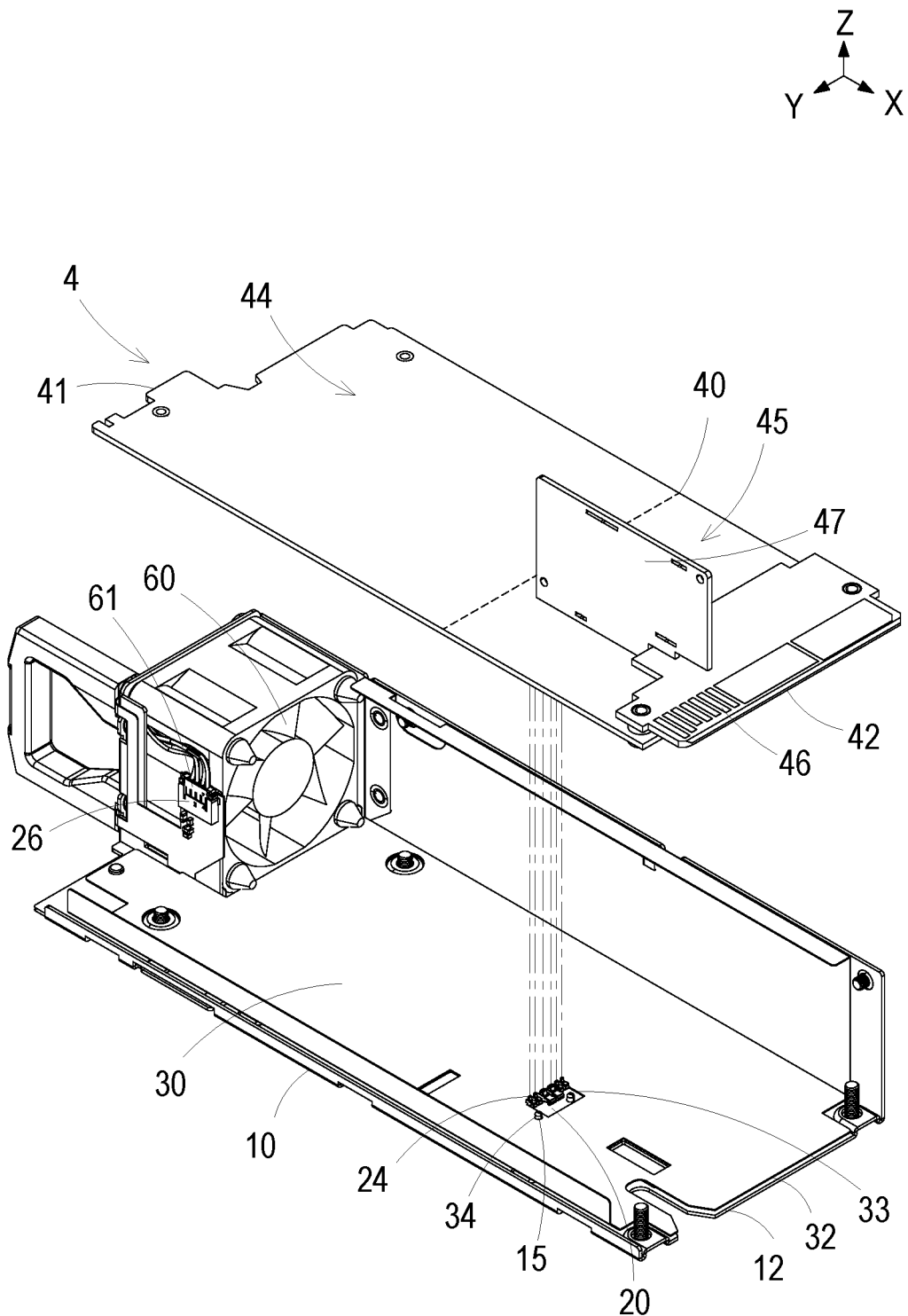
FIG. 11 shows the circuit board assembly correspondingly assembled to the insulator according the second embodiment of the present disclosure.

FIG. 8A, FIG. 8B, FIG. 9 to FIG. 11, FIG. 12A and FIG. 12B illustrate a power supply assembly according to a second embodiment of the present disclosure. In the embodiment, the structures, elements and functions of the power supply assembly 1a are similar to those of the power supply assembly 1 of FIG. 1 to FIG. 7, and are not redundantly described herein. In the embodiment, the positioning base 14a of the housing 10 further includes a reinforcing plate 17, which is connected between the flexible circuit board 20 and the carrying surface 13 of the housing 10, and configured to support the elastic conductor 24 of the flexible circuit board 20. In the embodiment, the positioning base 14a includes at least one positioning post 15, the flexible circuit board 20 includes at least one first positioning hole 25 spatially corresponding to the at least one positioning post 15, and the reinforcing plate 17 includes at least one second positioning hole 171 spatially corresponding to the at least on positioning post 15. When the flexible circuit board 20 (including the reinforcing plate 17) and the housing 10 are being assembled (as shown in FIG. 9), the at least one positioning post 15 passes through the at least one second positioning hole 171 and the at least one first positioning hole 25 sequentially to facilitate the reinforcing plate 17 and the flexible circuit board 20 to be assembled to the carrying surface 13 of the housing 10 along the second direction (i.e., the inverse Z axial direction), and allow the elastic conductor 24 to locate on the reinforcing plate 17. In addition, the insulator 30 further includes at least one auxiliary positioning hole 34 spatially corresponding to the at least one positioning post 15 and disposed adjacent to the opening 33. When the insulator 30 is being assembled to the flexible circuit board 20 and the housing 10 (as shown in FIG. 10), the at least one positioning post 15 passes through the at least one auxiliary positioning hole 34 to facilitate the opening 33 of the insulator 30 to align to the elastic conductor 24 of the flexible circuit board 20. In other words, when the flexible circuit board 20 or the insulator 30 is fixed to the carrying surface 13 of the housing 10 through the design of the positioning base 14, the first positioning post 15, the second positioning hole 171, the first positioning hole 25 and the auxiliary positioning hole 34, it helps to simplify the assembly process. Certainly, the present disclosure is not limited thereto.

Figure 12A:
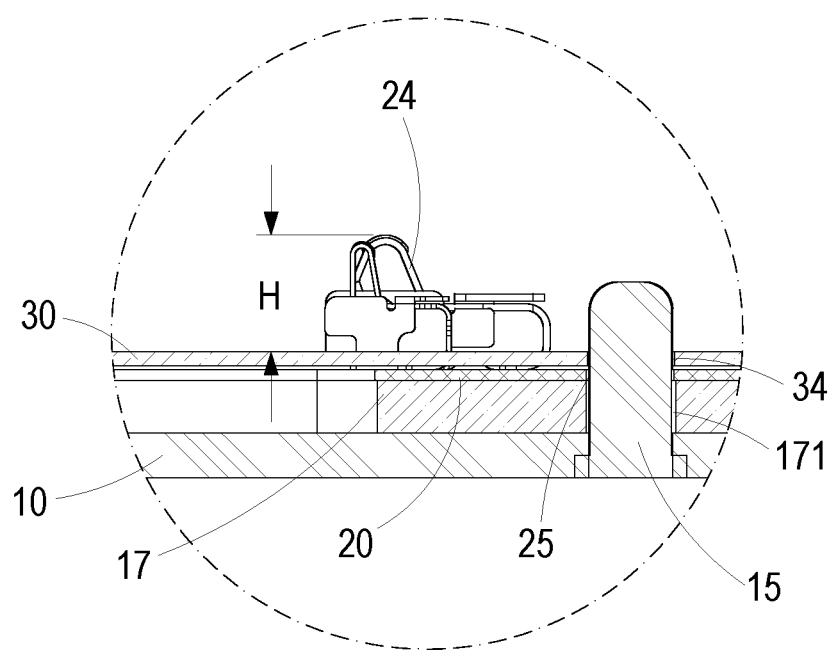
FIGS. 12A and 12B show the state of the elastic conductor in the power supply assembly before and after the main circuit board is assembled thereon according to the second embodiment of the present disclosure, respectively.
Figure 12B:
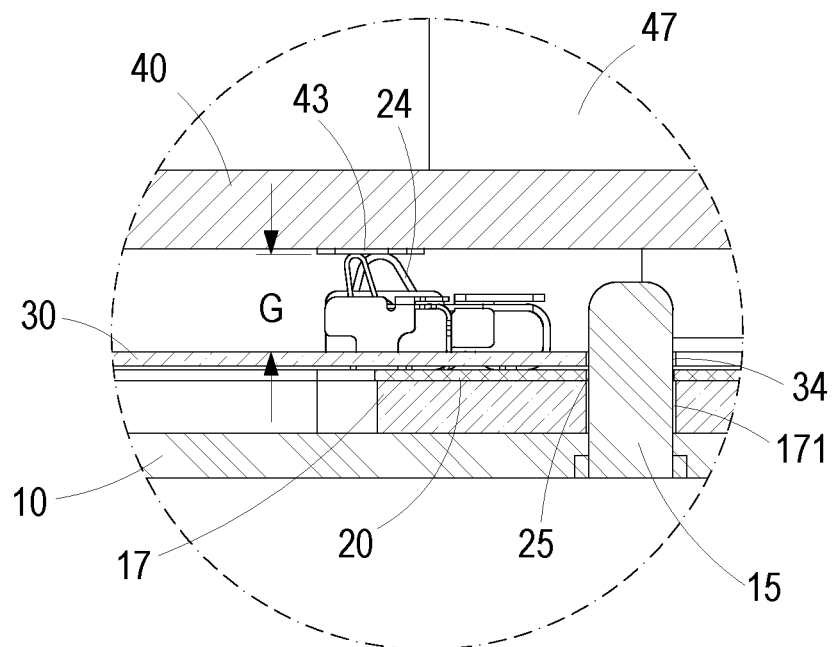

In the embodiment, after the housing 10, the flexible circuit board 20 and the insulator 30 are assembled, a protruding height H (as shown in FIG. 12A) is formed between the elastic conductor 24 of the flexible circuit board 20 and the top surface of the insulator 30. In addition, after the main circuit board 40 is assembled on the insulator 30, an installation gap G (as shown in FIG. 12B) is formed between the conductive pad 43 of the main circuit board 40 and the top surface of the insulator 30. Since the installation gap G is smaller than the protruding height H, when the main circuit board 40 of the circuit board assembly 4 is assembled to the insulator 30 and the housing 10, the conductive pad 43 on the bottom surface of the main circuit board 40 is close to the opening 33 of the insulator 30 and abutted against the elastic conductor 24 to form an electrical connection. Thereby, the assembly process is simplified, and the assembly of the main circuit board 40 can be achieved through the automated assembly. Certainly, the type in which the conductive pad 43 abutted against the elastic conductor 24 in the present disclosure is adjustable according to the practical requirements. On the other hand, the elastic conductor 24 of the flexible circuit board 20 can be supported by adding the reinforcing plate 17, and the protruding height H of the elastic conductor 24 through the opening 33 of the insulator 30 is adjustable to increase the reliability of the assembly structure. Certainly, the method of changing the protrusion height H in the present disclosure is not limited to the embodiment shown, and not described hereafter.

From the above descriptions, the present disclosure provides a power supply assembly implementing the electrical connection of LED indicator and a fan through a flexible circuit board to simplify the assembly structure, improve the space utilization and achieve the automated assembly of the main circuit board. The flexible circuit board that realizes the electrical connection of the LED indicator and the fan for power supply is arranged under the main circuit board and does not occupy the space for the components on the main circuit board. In addition, due to the thin thickness of the flexible circuit board, the space for the components under the main circuit board won't be occupied by the flexible circuit board. When the flexible circuit board is fixed to the carrying surface of the housing, it allows to simplify the assembly process through the design of the positioning base, the positioning posts and the positioning holes. On the other hand, the elastic conductor of the flexible circuit board can be supported by the protruding platform stamped from the housing or by adding a reinforcing plate, and the protruding height of the elastic conductor through the opening of the insulator is adjustable to increase the reliability of the assembly structure. When the LED indicator and the fan are disposed adjacent to the rear side of the housing, the power supply requirement can be realized through the flexible circuit board, and the flexible circuit board is fixed by the assembly and clamping of the housing and the insulator. The elastic conductor of the flexible circuit board are exposed and protruded to a protruding height through the opening of the insulator. When the main circuit board of the circuit board assembly is assembled to the insulator and the housing, an installation gap less than the protruding height is formed. Consequently, the conductive pad on the bottom surface of the main circuit board is close to the opening of the insulator and abutted against the elastic conductor to form an electrical connection. Thereby, the assembly process is simplified, and the assembly of the main circuit board can be achieved through the automated assembly. On the other hand, when the circuit board assembly is installed on the housing and the insulator, the input socket, the primary side circuit, the secondary side circuit and the output golden fingers on the circuit board assembly are arranged from the rear end side of the housing to the front side of the housing.

The power supply requirements for the electrical devices adjacent to the rear side can be connected through the flexible circuit board between the insulator and the housing, and then electrically connected to the synchronous rectifier (SR) circuit board on the secondary side circuit through the conductive pad on the bottom of the main circuit board. The flexible circuit board is sandwiched between the housing and the insulator, and a sufficient distance is maintained between the primary side circuit and the secondary side circuit. In other words, since the LED indicator and the fan arranged adjacent to the rear side of the housing are electrically connected to the conductive pad below the main circuit board through the flexible circuit board, it helps to simplify the assembly structure of the housing, the flexible circuit board, the insulator and the circuit board assembly. Moreover, the flexible circuit board can be pre-fixed to the housing. It avoids the use of the flying wire and won't be restricted by the wire management. Consequently, the space utilization is improved and it has advantage of realizing the automatic assembly of the main circuit board.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power supply assembly comprising: a housing comprising a first end side and a second end side opposite to each other, a carrying surface and a positioning base, wherein the positioning base is disposed on the carrying surface and located between the first end side and the second end side; a flexible circuit board disposed on the carrying surface, and extended from the first end side along a first direction to the positioning base, wherein the flexible circuit board comprises a LED indicator and an elastic conductor, the LED indicator is disposed adjacent to the first end side of the housing, and the elastic conductor is disposed on the positioning base; an insulator comprising an opening spatially corresponding to the elastic conductor and the positioning base, wherein the insulator is assembled to the carrying surface of the housing, the flexible circuit board is arranged between the carrying surface of the housing and the insulator, and the elastic conductor is exposed through the opening; and a circuit board assembly comprising a main circuit board having a conductive pad spatially corresponding to the opening and the elastic conductor, wherein the circuit board assembly is assembled to the insulator, the conductive pad of the main circuit board is close to the opening, and the conductive pad and the elastic conductor are abutted against each other, so that the LED indicator and the main circuit board are electrically connected to each other, wherein the circuit board assembly comprises a primary side circuit and a secondary side circuit, which are spatially corresponding to the first end side of the housing and the second end side of the housing, respectively.

2. The power supply assembly according to claim 1, wherein the flexible circuit board further comprises a connector disposed adjacent to the first end side of the housing and electrically connected to the elastic conductor.

3. The power supply assembly according to claim 2, further comprising a fan disposed adjacent to the first end side of the housing and electrically connected to the connector.

4. The power supply assembly according to claim 1, wherein the housing, the flexible circuit board, the insulator and the circuit board assembly are assembled along a second direction sequentially, wherein the second direction is perpendicular to the first direction.

5. The power supply assembly according to claim 1, wherein the main circuit board comprises a gold finger spatially corresponding to the second end side of the housing, and disposed adjacent to the second end side.

6. The power supply assembly according to claim 5, further comprising an input socket connected to the main circuit board and disposed adjacent to the first end side of the housing.

7. The power supply assembly according to claim 6, wherein the input socket, the primary side circuit, the secondary side circuit and the gold finger are disposed on the main circuit board and arranged along the first direction sequentially, the primary side circuit is located between the input socket and the secondary side circuit, and the secondary side circuit is located between the primary side circuit and the gold finger.

8. The power supply assembly according to claim 1, wherein the positioning base comprises a protruding platform stamped from the carrying surface and configured to support the elastic conductor of the flexible circuit board.

9. The power supply assembly according to claim 8, wherein the positioning base comprises at least one positioning post, and the flexible circuit board comprises at least one first positioning hole spatially corresponding to the at least one positioning post, wherein the at least one positioning post passes through the at least one first positioning hole to facilitate the flexible circuit board to be assembled to the carrying surface of the housing along a second direction, and allow the elastic conductor to locate on the protruding platform, wherein the second direction is perpendicular to the first direction.

10. The power supply assembly according to claim 9, wherein the insulator further comprises at least one auxiliary positioning hole spatially corresponding to the at least one positioning post and disposed adjacent to the opening, wherein the at least one positioning post passes through the at least one auxiliary positioning hole to facilitate the opening of the insulator to align to the elastic conductor of the flexible circuit board.

11. The power supply assembly according to claim 1, wherein the positioning base comprises a reinforcing plate connected between the flexible circuit board and the carrying surface, and configured to support the elastic conductor of the flexible circuit board.

12. The power supply assembly according to claim 11, wherein the positioning base comprises at least one positioning post, the flexible circuit board comprises at least one first positioning hole spatially corresponding to the at least one positioning post, and the reinforcing plate comprises at least one second positioning hole spatially corresponding to the at least on positioning post, wherein the at least one positioning post passes through the at least one second positioning hole and the at least one first positioning hole sequentially to facilitate the reinforcing plate and the flexible circuit board to be assembled to the carrying surface of the housing along a second direction, wherein the second direction is perpendicular to the first direction.

13. The power supply assembly according to claim 12, wherein the insulator further comprises at least one auxiliary positioning hole spatially corresponding to the at least one positioning post and disposed adjacent to the opening, wherein the at least one positioning post passes through the at least one auxiliary positioning hole to facilitate the opening of the insulator to align to the elastic conductor of the flexible circuit board.

14. The power supply assembly according to claim 1, wherein the housing, the flexible circuit board and the insulator are assembled to form a protruding height between the elastic conductor of the flexible circuit board and the insulator, the main circuit board is assembled on the insulator to form an installation gap between the conductive pad of the main circuit board and the insulator, and the installation gap is smaller than the protruding height.

15. The power supply assembly according to claim 1, wherein the circuit board assembly further comprises a synchronous rectifier circuit board inserted into the main circuit board and spatially corresponding to the conductive pad.

* * * * *